(12) United States Patent
Bradshaw

(10) Patent No.: US 10,042,018 B2
(45) Date of Patent: Aug. 7, 2018

(54) MRI SCANNER

(71) Applicant: INVIVO CORPORATION, Andover, MA (US)

(72) Inventor: Kenneth Bradshaw, Bear, DE (US)

(73) Assignee: INVIVO CORPORATION, Andover, MA (US)

( * ) Notice: Subject to any disclaimer, the term of this patent is extended or adjusted under 35 U.S.C. 154(b) by 884 days.

(21) Appl. No.: 14/388,132

(22) PCT Filed: Mar. 15, 2013

(86) PCT No.: PCT/US2013/032001
§ 371 (c)(1),
(2) Date: Sep. 25, 2014

(87) PCT Pub. No.: WO2013/148310
PCT Pub. Date: Oct. 3, 2013

(65) Prior Publication Data
US 2015/0084631 A1  Mar. 26, 2015

Related U.S. Application Data

(60) Provisional application No. 61/616,688, filed on Mar. 28, 2012.

(51) Int. Cl.
| G01R 33/385 | (2006.01) |
| G01R 33/38 | (2006.01) |
| G01R 33/44 | (2006.01) |
| G01R 33/30 | (2006.01) |
| G01R 33/3875 | (2006.01) |
| G01R 33/48 | (2006.01) |

(52) U.S. Cl.
CPC ......... *G01R 33/3852* (2013.01); *G01R 33/30* (2013.01); *G01R 33/3806* (2013.01); *G01R 33/3808* (2013.01); *G01R 33/3858* (2013.01); *G01R 33/3875* (2013.01); *G01R 33/445* (2013.01); *G01R 33/48* (2013.01)

(58) Field of Classification Search
CPC .. G01R 33/48; G01R 33/445; G01R 33/3875; G01R 33/3858; G01R 33/3808; G01R 33/3806; G01R 33/30; G01R 33/3852
See application file for complete search history.

(56) References Cited

U.S. PATENT DOCUMENTS

| 5,677,630 A | 10/1997 | Laskaris |
| 5,814,993 A | 9/1998 | Frese |
| 6,462,548 B1 | 10/2002 | Havens |

(Continued)

*Primary Examiner* — Gregory H Curran

(57) ABSTRACT

Systems and methods for improving patient comfort and throughput of magnetic resonance imaging by providing at least one patient imaging area outside a bore of a magnet of a magnetic resonance imaging device. An embodiment of an apparatus for providing at least one patient imaging area outside the bore comprises a first shim disposed external to and spaced apart from a first opening of the bore to form a first patient imaging area between the first shim and the first opening, wherein the first shim is configured to direct a magnetic field of the magnet into the first patient imaging area to provide a first magnetic field in the first patient imaging area. Methods of magnetic resonance imaging outside the bore are also disclosed.

18 Claims, 10 Drawing Sheets

(56) References Cited

U.S. PATENT DOCUMENTS

| | | | |
|---|---|---|---|
| 7,123,008 B1 * | 10/2006 | Damadian | G01R 33/3806 324/309 |
| 7,245,128 B2 | 7/2007 | Ando | |
| 7,970,452 B2 | 6/2011 | Piron | |
| 8,160,674 B2 * | 4/2012 | Kuth | A61B 5/0555 324/309 |
| 2004/0138553 A1 | 7/2004 | Damadian | |
| 2010/0102815 A1 | 4/2010 | Parker | |
| 2010/0174172 A1 * | 7/2010 | Ein-Gal | A61B 5/055 600/411 |
| 2010/0308820 A1 | 12/2010 | Blank | |

\* cited by examiner

MRI SCANNER

CROSS REFERENCE TO RELATED APPLICATIONS

This application is a National Stage Application under 35 U.S.C. § 371 from Patent Cooperation Treaty (PCT) Application No. PCT/US2013/032001, filed Mar. 15, 2013 which claims priority to U.S. Provisional Patent Application No. 61/616,688 filed on Mar. 28, 2012 of which is hereby incorporated by reference in its entirety for all purposes.

BACKGROUND

1. Field of the Invention

The present invention generally relates to magnetic resonance imaging.

2. Description of Background

Magnetic resonance imaging (MRI) uses magnetic fields to image a tissue of a patient placed inside a powerful uniform magnetic field of an MRI scanner. The MRI scanner can align the magnetic moments of protons in the tissue (typically hydrogen protons of water molecules in the tissue) in the direction of the field, precessing about the field at their Larmor frequency. An excitation field (typically orthogonal to the main magnetic field) near the Larmor frequency is applied to alter the alignment of the protons in the tissue, typically flipping the magnetic moment of the protons in the main field. When the excitation field is turned off, the protons emit a photon that can be detected and processed to form an MRI image of the tissue.

SUMMARY

Aspects of the present disclosure are directed to providing systems and methods that allow efficient screening of patients using MRI. While MRI may be functionally and morphologically more sensitive than other imaging techniques, such as ultrasound imaging, MRI is typically used for diagnosis rather than screening. This is because the long set-up times, low throughout and inefficient workflow associated with MRI make it ineffective for patient screening.

With respect to imaging only a portion of a patient, such as breast tissue, MRI set-up times may be long and throughput may be limited with the patient reclining as compared to mammography imaging with the patient standing or in a vertical position, resulting in less patients being imaged each day. Furthermore, MRI imaging of a patient may be more uncomfortable than other imaging techniques, such as ultrasound imaging or, in the case of breast scanning, mammography imaging. MRI imaging may also trigger claustrophobia for some patients, for example due to the patient being immersed into a narrow MRI bore in a reclined position and subjected to loud noise during operation of the MRI.

Aspects and embodiments presented herein overcome some of the current problems with MRI imaging by providing MRI systems and methods that improve patient set-up time and throughput as well as patient comfort, thereby allowing the effective use of MRI for patient screening. According to an aspect of the present disclosure, MRI scanners and methods provide at least one patient imaging area outside the bore of the MRI scanner, thereby enabling more comfortable imaging and improved throughput. The bore may be a cylindrical tunnel located within the magnet of the MRI scanner.

According to one aspect, an apparatus for providing at least one patient imaging area outside a bore located within a magnet of a magnetic resonance imaging device comprises a first shim disposed external to and spaced apart from a first opening of the bore to form a first patient imaging area between the first shim and the first opening. The first shim may be configured to direct a magnetic field of the magnet within the bore into the first patient imaging area to provide a first magnetic field in the first patient imaging area.

The foregoing aspect may include any one or more of the following embodiments. In some embodiments, the first magnetic field may be substantially homogeneous. In some embodiments, the first shim and the bore may provide the first magnetic field within the first patient imaging area, the first magnetic field being substantially parallel to the magnetic field within the bore.

In some embodiments, the apparatus may further comprise any or a combination of: a second shim disposed between the first opening and the first shim and configured to provide the first magnetic field, the first patient imaging area being formed between the first shim and the second shim; a ferric connector coupled to the first shim and a second opening of the bore and configured to direct the magnetic field externally of the magnetic resonance imaging device; an enclosure sized to enclose the magnetic resonance imaging device, the enclosure having a plurality of surfaces including at least one of the first shim and the ferric connector; at least one gradient amplifier disposed external to the magnetic resonance imaging device and external to the first patient imaging area, the at least one gradient amplifier being configured to amplify a gradient magnetic field within the first patient imaging area; a secondary shim coupled to the first shim and configured to create the first magnetic field that is substantially homogeneous in the first patient imaging area; the first shim may include an integral portion configured to extend towards the first opening and a second portion that is disposed substantially perpendicular to the bore; a first gradient coil and a second gradient coil disposed between the first shim and the first opening, the first patient imaging area being formed between the first gradient coil and the second gradient coil; the first gradient coil and the second gradient coil may be configured to generate a gradient magnetic field within the first patient imaging area; at least one radio frequency coil disposed within the first patient imaging area and configured to at least one of transmit and receive a radio frequency signal for magnetic resonance imaging within the first patient imaging area; an immobilization structure in the first patient imaging area; the immobilization structure may be configured to receive a tissue to be imaged and to immobilize the tissue for imaging; a second shim disposed external to and spaced apart from a second opening of the bore to form a second patient imaging area between the second shim and the second opening; the second shim may be configured to direct the magnetic field of the magnet into the second patient imaging area to provide a second magnetic field in the second patient imaging area; the second magnetic field may be substantially homogeneous; the second shim and the bore may provide the second magnetic field within the second patient imaging area, the second magnetic field being substantially parallel to the magnetic field within the bore; at least one ferric connector coupled to at least one of the first shim and the second shim; and the at least one ferric connector may be configured to direct the magnetic field externally to the magnetic resonance imaging device and along a direction substantially parallel to the bore.

According to another aspect, there is provided a magnetic resonance imaging apparatus comprising a magnet having a bore and configured to generate a substantially homogeneous magnetic field within the bore and a first shim disposed external to a first opening of the bore to form a first patient imaging area between the first shim and the first opening. The first shim may be configured to extend the magnetic field within the bore into the first patient imaging area to provide a first magnetic field in the first patient imaging area.

This aspect may include any one or more of the following embodiments. In some embodiments, the first magnetic field may be substantially homogeneous. In some embodiments, the first magnetic field may be substantially parallel to the magnetic field within the bore.

In some embodiments, the magnetic resonance imaging apparatus may further comprise any or a combination of: at least one ferric connector coupled to the first shim and extending along a length of the magnet; the at least one ferric connector may be configured to direct the magnetic field externally to the magnet and along a direction substantially parallel to the bore; an enclosure sized to enclose the magnet, the enclosure having a plurality of surfaces including the first shim and the at least one ferric connector; at least one gradient amplifier disposed within the enclosure and external to the magnet and to the first patient imaging area; the at least one gradient amplifier may be configured to amplify a gradient magnetic field within the first patient imaging area; at least one secondary shim coupled to the first shim; the first shim may include an integral portion configured to extend towards the bore and a second portion that is disposed substantially perpendicular to the bore; a first gradient coil and a second gradient coil disposed between the first shim and the first opening, the first patient imaging area being formed between the first gradient coil and the second gradient coil; the first gradient coil and the second gradient coil may be configured to generate a first gradient magnetic field within the first patient imaging area; a second shim coupled to the first opening of the bore and to at least one of the first gradient coil and the second gradient coil the first patient imaging area may be configured to receive a patient to be imaged in at least one of a seated position and a standing position; at least one immobilization structure in the first patient imaging area, the at least one immobilization structure being configured to receive a tissue to be imaged and to immobilize the tissue for imaging; and at least one radio frequency coil within the first patient imaging area, the at least one radio frequency coil being configured to at least one of transmit and receive a radio frequency signal for magnetic resonance imaging.

In yet another aspect, a magnetic resonance imaging apparatus comprises a first magnet having a bore and a second magnet having a bore. Formed between the first magnet and the second magnet is a patient imaging area. Optionally, at least one ferric connector has a first end coupled to the first magnet, such as via an end of the bore of the first magnet, and a second end coupled to the second magnet, such as via an end of the bore of the second magnet. The at least one ferric connector is configured to draw a magnetic field external to the first magnet and the second magnet. Additionally and optionally, a first shim is coupled to a first end of the bore of the second magnet, wherein the first end of the bore is proximate to the patient imaging area. The second magnet may generate a magnetic field that has a same direction as a magnetic field of the first magnet.

According to another aspect, a method of providing at least one patient imaging area outside a bore located within a magnet of a magnetic resonance imaging device comprises acts of positioning a first shim external to and spaced apart from a first opening of the bore to form a first patient imaging area between the first shim and the first opening; and configuring the first shim to direct a magnetic field of the magnet to the first patient imaging area to provide in combination with the bore a first magnetic field in the first patient imaging area.

This aspect may include any one or more of the following embodiments. In some embodiments, the first magnetic field may be substantially homogeneous. In some embodiments, configuring the first shim may further include configuring the first shim to direct the magnetic field within the bore into the first patient imaging area such that the first magnetic field is substantially parallel to the magnetic field within the bore.

In some embodiments, the method may further comprise any or a combination of: positioning a second shim between the first opening of the bore and the first shim; configuring the second shim to provide the first magnetic field in combination with at least the first shim; providing at least one secondary shim coupled to the first shim to provide the substantially homogeneous first magnetic field; providing at least one ferric connector coupled to the first shim to direct the magnetic field externally to the magnetic resonance imaging device; configuring the at least one ferric connector to direct the magnetic field externally to the magnetic resonance imaging device and along a direction substantially parallel to the bore; enclosing the magnetic resonance imaging device using at least one of the first shim and the at least one ferric connector; providing the first shim with an integral portion configured to extend towards the bore and a second portion that is substantially perpendicular to the bore; positioning at least one gradient amplifier external to the magnetic resonance imaging device and external to the first patient imaging area; configuring the at least one gradient amplifier to amplify a gradient magnetic field within the first patient imaging area; positioning a first gradient coil and a second gradient coil between the first shim and the first opening, the first patient imaging area being formed between the first gradient coil and the second gradient coil; configuring the first gradient coil and the second gradient coil to generate a first gradient magnetic field within the first patient imaging area; configuring the first patient imaging area to receive a patient to be imaged in at least one of a seated position and a standing position; providing at least one immobilization structure in the first patient imaging area; configuring the at least one immobilization structure to receive a tissue to be imaged and to immobilize the tissue; providing at least one radio frequency coil within the first patient imaging area and configuring the at least one radio frequency coil to at least one of transmit and receive a radio frequency signal for magnetic resonance imaging; positioning a second shim external to and spaced apart from a second opening of the bore to form a second patient imaging area between the second shim and the second opening; configuring the second shim to direct the magnetic field of the magnet to the second patient imaging area to provide in combination with the bore a second magnetic field in the second patient imaging area; providing the second magnetic field to be substantially homogeneous; configuring the second shim to direct the magnetic field within the bore into the second patient imaging area such that the second magnetic field is substantially parallel to the magnetic field within the bore; positioning a third gradient coil and a fourth gradient coil between the second shim and the second opening, the second patient imaging area being formed between the third gradient coil and the fourth gradient coil; and configuring the third gradient coil and the fourth gradient coil to generate a second gradient magnetic field within the second patient imaging area.

According to another aspect, a method of imaging using a magnetic resonance imaging apparatus having a bore comprises imaging a first patient in a first imaging volume between a first end of the bore and a first shim disposed external to and spaced apart from the first end of the bore using a first magnetic field provided by the bore and the first shim in the first imaging volume.

This aspect may include one or more of the following embodiments. In some embodiments, the first magnetic field may be substantially homogeneous in the first imaging volume. In some embodiments, the method may further comprise any or a combination of any of: providing a first gradient magnetic field in the first imaging volume using a first gradient coil and a second gradient coil positioned between the first shim and the first end; at least one of transmitting and receiving a radio frequency signal for magnetic resonance imaging; immobilizing a tissue of the first patient; imaging in one of a seated position and a standing position; imaging a second patient in a second imaging volume between a second end of the bore and a second shim disposed external to and spaced apart from the second end of the bore using a second magnetic field provided by the bore and the second shim in the second imaging volume; imaging the first patient and imaging the second patient may overlap; and imaging the first patient and imaging the second patient may be performed substantially simultaneously.

Still other aspects, embodiments, and advantages of these exemplary aspects and embodiments are discussed in detail below. Embodiments disclosed herein may be combined with other embodiments or aspects in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment or aspect. The appearances of such terms herein are not necessarily all referring to the same embodiment. Features and advantages discussed in connection with any one or more embodiments according to one or more aspects are not intended to be excluded from a similar role in any other embodiment or aspect.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Figure 1:
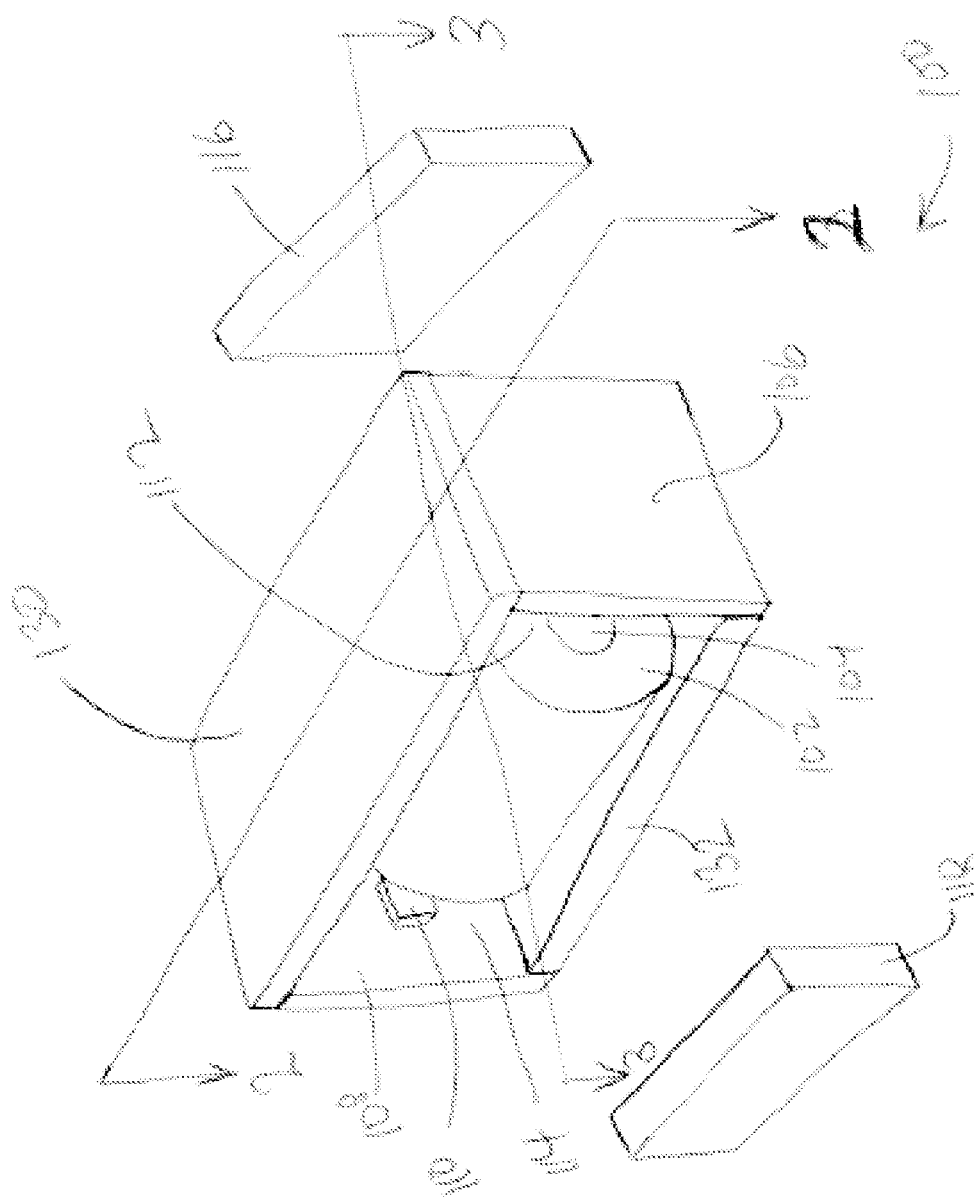
FIG. 1 is a schematic diagram showing one embodiment of a magnetic resonance imaging apparatus according to aspects of the present disclosure.

According to aspects and embodiments herein, an MRI scanner may use a horizontal superconducting magnetic resonance magnet, but instead of using the bore within the magnet as the imaging space, which typically involves positioning the patient within the bore of the magnet for imaging, a patient imaging area is provided outside the bore. According to one aspect, a conventional MRI apparatus may be retrofitted to provide at least one patient imaging area outside the bore, for example to increase patient comfort or throughput of the MRI apparatus.

A patient imaging area may be provided outside the bore by using ferric shimming materials, which in some embodiments can be iron or other magnetic field concentrators. In various embodiments, shims may comprise ferromagnetic materials, superconducting coils or resistive coils that may reshape the magnetic field. For example, shims may comprise materials or coils that add or subtract field from the main magnetic field so as to improve homogeneity of the magnetic field. Shimming materials may be placed near an opening of the magnet bore, and configured to direct the magnetic field out of the bore, into an area proximate to the entrance to the magnet bore.

In one embodiment, shimming materials are placed outside one end of the magnet bore to provide a patient imaging area outside one end of the bore. In another embodiment, shimming materials are placed on either side of the magnet, each being proximate to a respective opening or end of the bore of the magnet to provide a plurality of patient imaging areas outside the bore. In some embodiments, the shimming materials may comprise coils configured to direct or reshape the magnetic field. Shimming materials may be connected by one or more ferric connectors, also referred to as magnetic field returns, to create a magnetic circuit when the MRI scanner is operated, whereby the magnetic field is drawn out of the bore into an area proximate to an opening of the bore. In some embodiments, there may be shaping of the ferrous material that is used for the magnetic field return. The ferrous material helps constrain the magnetic field in a limited space. In some embodiments, the magnetic field is directed in a loop around the magnet, completing the circuit by passing through an area proximate to the opposite opening of the bore and back through the bore. In one example, the loop may be a rectangular path. Directing the magnetic field around the magnet can provide patient imaging areas outside of the magnet of the MRI scanner, proximate to the bore openings, generating a substantially homogeneous magnetic field that is substantially parallel to the uniform ($B_0$) field of the magnet so that patients may be positioned in the imaging areas outside the bore for imaging. Thus, it is possible to image two patients at each time, each patient positioned external to the bore, proximate one end of the bore.

In various embodiments, using flat gradient coils and radio frequency (RF) coils positioned in a patient area, an MRI image of a portion of the patient contained in the magnetic field extending out of the bore can be obtained. Skilled persons will appreciate that in some embodiments, the imaging volume can be homogeneous as compared to the bore center of a horizontal MRI magnet and that in some embodiments, swept RF imaging may be used in imaging the patient, for example, in magnetic field homogeneities up to 1000 ppm.

As used herein, imaging area may also be referred to as imaging volume or patient space. Furthermore, imaging a patient may refer to imaging one or more of a tissue, organ or other portion of the patient. For example, various embodiments described herein may be used in breast imaging or may also be used for lung, chest, kidney, liver, prostate, head, or any other imaging region of interest.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

It is to be appreciated that for simplicity and clarity of illustration, where considered appropriate, reference numerals may be repeated among the figures to indicate corresponding or analogous elements or steps.

Referring to FIG. 1, there is shown one embodiment of an MRI scanner 100 comprising a magnet 102 having a bore 104. On either side of the magnet 102, proximate to the bore 104, shims 106 and 108 are positioned to form patient imaging areas 112 and 114 outside the bore. The shims 106 and 108 may be ferric shims or may include superconducting or resistive coils. The first shim 106 is disposed external to and spaced apart from a first opening of the bore 104 to form the first patient imaging area 112 between the first opening and the first shim. The second shim 108 is disposed external to and spaced apart from a second opening of the bore to form the second patient imaging area 114 outside the bore, between the second opening of the bore and the second shim. In some embodiments, shims 106 and 108 may be comprised of iron, or, additionally or alternatively, another ferric material. The shims 106 and 108 may be configured to draw, constrain or focus the $B_0$ magnetic field of the magnet 102 out of the bore 104 and into the patient imaging areas external to the bore. In some embodiments, a shim may be configured to provide a substantially homogeneous magnetic field within a respective imaging area.

A shim may further include a secondary shim. In various embodiments, secondary shims may be secondary ferric shims or may include superconducting or resistive coils. In some embodiments, the apparatus may include at least one secondary shim that is separate from the primary shims 106, 108. In FIG. 1, a secondary shim 110 is shown to be positioned within the second patient imaging area 114 and configured to affect the magnetic field within the second patient imaging area. The secondary shim 110 may be coupled to the shim 108 and in some embodiments may be centered on the shim 108 and extending towards the bore 104. An additional secondary shim (not shown in FIG. 1, but shown as secondary shim 120 in FIGS. 2 and 3) may be positioned in a similar manner on shim 106. Secondary shims 110 and 120 may be configured to focus the $B_0$ magnetic field to provide a substantially homogeneous magnetic field within each of the patient imaging areas 112 and 114.

The first shim 106 and the second shim 108 in FIG. 1 are connected using ferric connectors 130 and 132. The ferric connectors 130 and 132 may comprise ferromagnetic returns. The ferric connectors 130 and 132 may be configured to direct the magnetic field of the MRI scanner 100 external to the magnet 102. In various embodiments, one or more ferric connectors may be configured to constrain the magnetic field to a space just outside the bore of the magnet. In various embodiments, a ferric connector may further extend through the bore of the magnet of the MRI scanner.

In various embodiments, the magnet 102 having the bore 104 may be included in a conventional MRI device. An apparatus for retrofitting the conventional MRI device may be provided according to aspects of the present disclosure. The apparatus may include, for example, one or more shims, secondary shims or ferric connectors configured to direct a magnetic field of the conventional MRI from within the bore to at least one imaging area outside the bore and to form a substantially homogeneous magnetic field within at least one imaging area. In some embodiments, the apparatus may include an enclosure having one or more surfaces including one or more shims and ferric connectors. In some embodiments, the enclosure may be configured to increase patient comfort. For example, the enclosure may be configured to provide a patient imaging area that is private. Such embodiments may provide a more comfortable experience when two patients are being imaged, for example by allowing each patient being imaged to be in a separate room from the other patient being imaged, with the enclosed structure forming one wall of each room. In some embodiments, the enclosure may be sound proofed to dampen the noise generated during operation of the MRI device, thereby creating a more comfortable patient experience.

Figure 2:
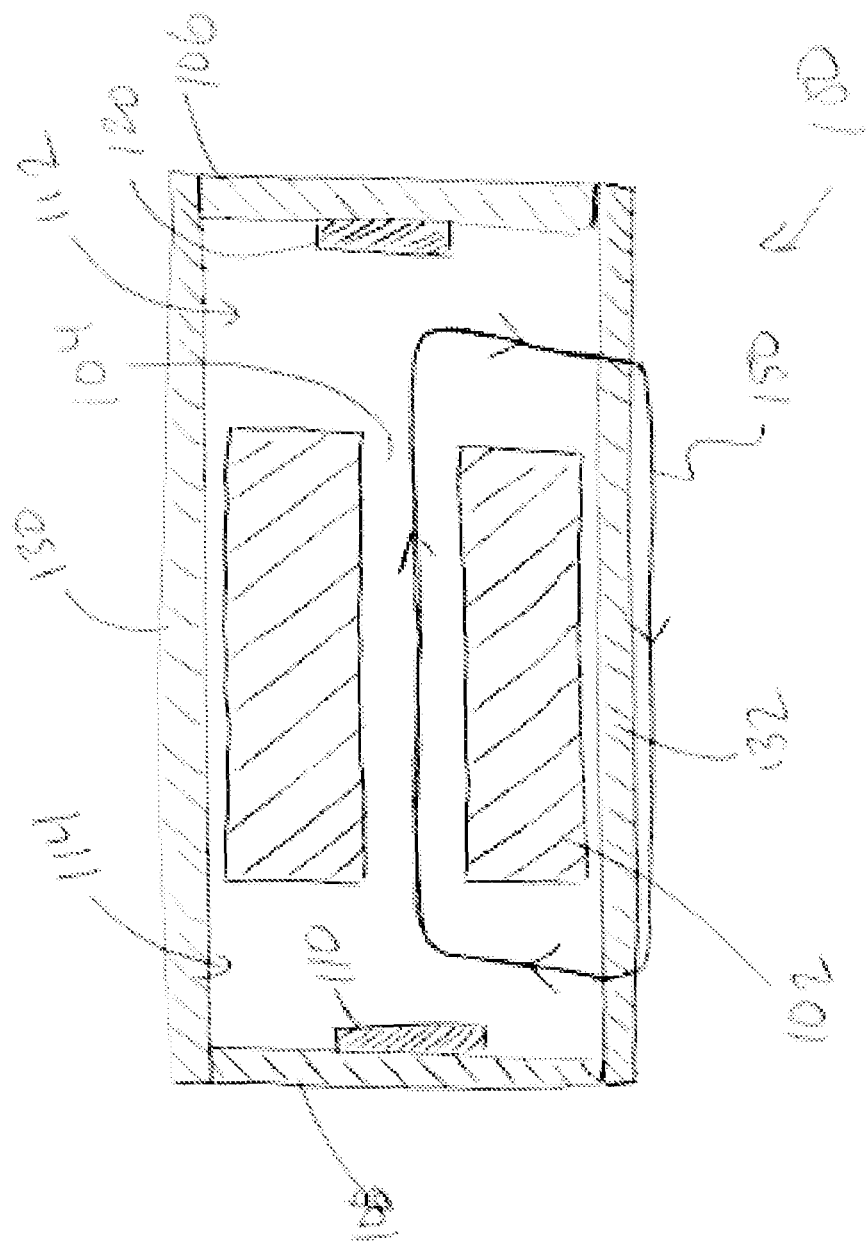
FIG. 2 is a cross-sectional view of the magnetic resonance imaging apparatus of FIG. 1 along line 2-2.
Figure 3:
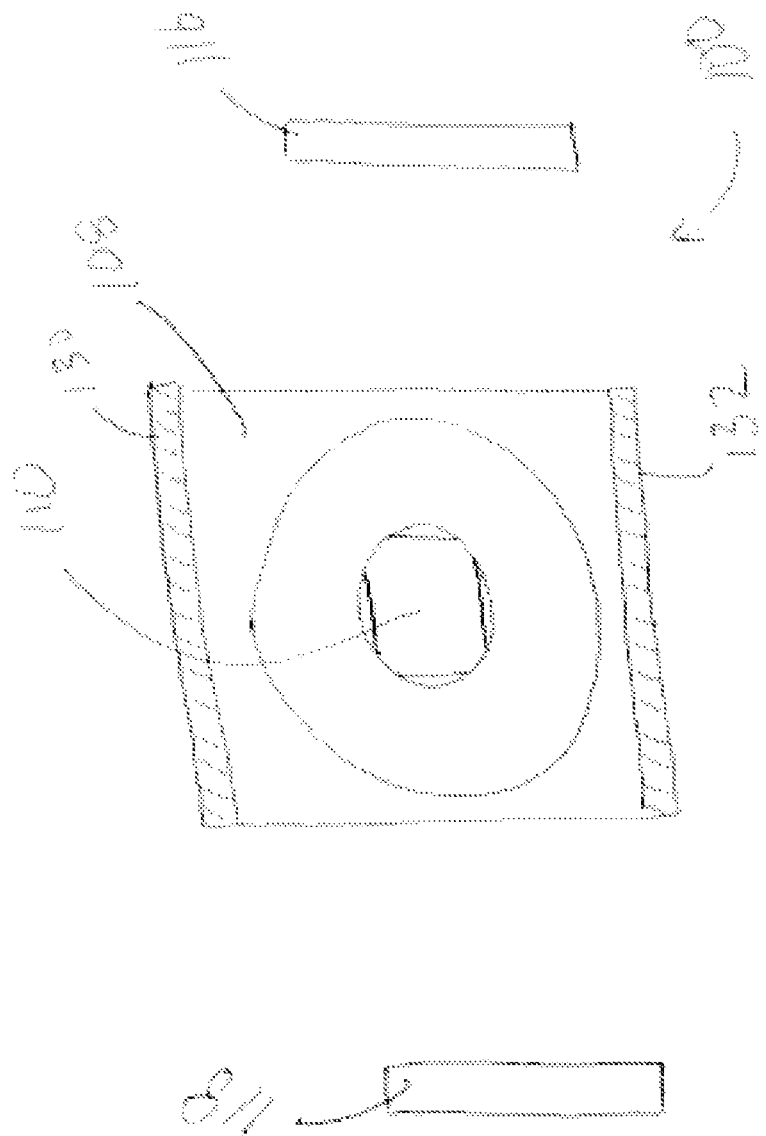
FIG. 3 is a cross-sectional view of the magnetic resonance imaging apparatus of FIG. 1 along line 3-3.

FIGS. 2 and 3 show cross-sectional views of the MRI scanner 100 of FIG. 1 along line 2-2 and line 3-3, respectively. As shown in FIG. 2, shims 106 and 108 may be substantially symmetric and connected by the ferric connectors 130 and 132, to complete magnetic circuit 150 in a loop path through the bore 104 and around an outer surface of the magnet 102. In one example, the loop path may be a substantially rectangular path. The secondary shims 110 and 120 are shown to be disposed within the patient imaging areas 114 and 112 respectively.

When the MRI scanner 100 is operated, the $B_0$ magnetic field is drawn out of the bore 104 into the first patient imaging area 112 and then is directed perpendicular to the $B_0$ magnetic field along the magnetic circuit 150 towards the second shim 108 and enters the second patient imaging area 114. Outside the magnet 102, the redirected magnetic field may be substantially parallel to the magnetic field within the bore 104. The redirected magnetic field may be directed perpendicular to the $B_0$ magnetic field of the magnet 102 as it enters the second patient imaging area 114, where it is directed substantially parallel to the $B_0$ magnetic field through the bore 104. In various embodiments, one or more of the shims, secondary shims and ferric connectors may be configured to provide a magnetic field that is substantially homogeneous within the patient imaging areas. For example, the shims 106, 108, the secondary shims 120, 110, and the ferric connectors 130, 132 are configured to provide a first magnetic field that is substantially homogeneous within the first patient imaging area 112 and a second magnetic field that is substantially homogeneous in the second patient imaging area 114.

Referring again to FIG. 1 and the corresponding cross-sectional view in FIG. 3, gradient amplifiers 116 and 118 are positioned on either side of the magnet 102. In various embodiments, one or more gradient amplifiers may be positioned in a separate room than the magnet 102. In some embodiments, the gradient amplifiers may be configured to amplify a gradient magnetic field used for magnetic resonance imaging. Gradient magnetic fields being amplified may be within at least one of the first patient imaging area 112 and the second patient imaging area 114. In some embodiments, RF coils or RF amplifiers may additionally be positioned on either side of the magnet 102. In some embodiments, as described above, the magnet 102 may be positioned within an enclosed structure, such as a wall, and in such embodiments the gradient amplifiers and RF amplifiers may be placed in the same enclosed structure.

In the embodiment illustrated in FIGS. 1, 2 and 3, the patient imaging areas 112 and 114 are large enough that a patient may be positioned within them, for example in a standing position or sitting position. As described above, the first shim 106, having secondary shim 120 is positioned such that, when the MRI scanner 100 is operated, the $B_0$ magnetic field of the magnet 102 is drawn out of the bore 104 into the first patient imaging area 112 whereby the drawn out $B_0$ magnetic field is substantially homogeneous in the first patient imaging area 112 and substantially parallel to the $B_0$ magnetic field within the bore. Similarly, the second shim 108, having secondary shim 110, is positioned such that the returned field of the magnetic circuit 150 is substantially homogeneous in the second patient imaging area 114 and substantially parallel to the $B_0$ magnetic field within the bore 104 of the magnet 102.

Figure 4:
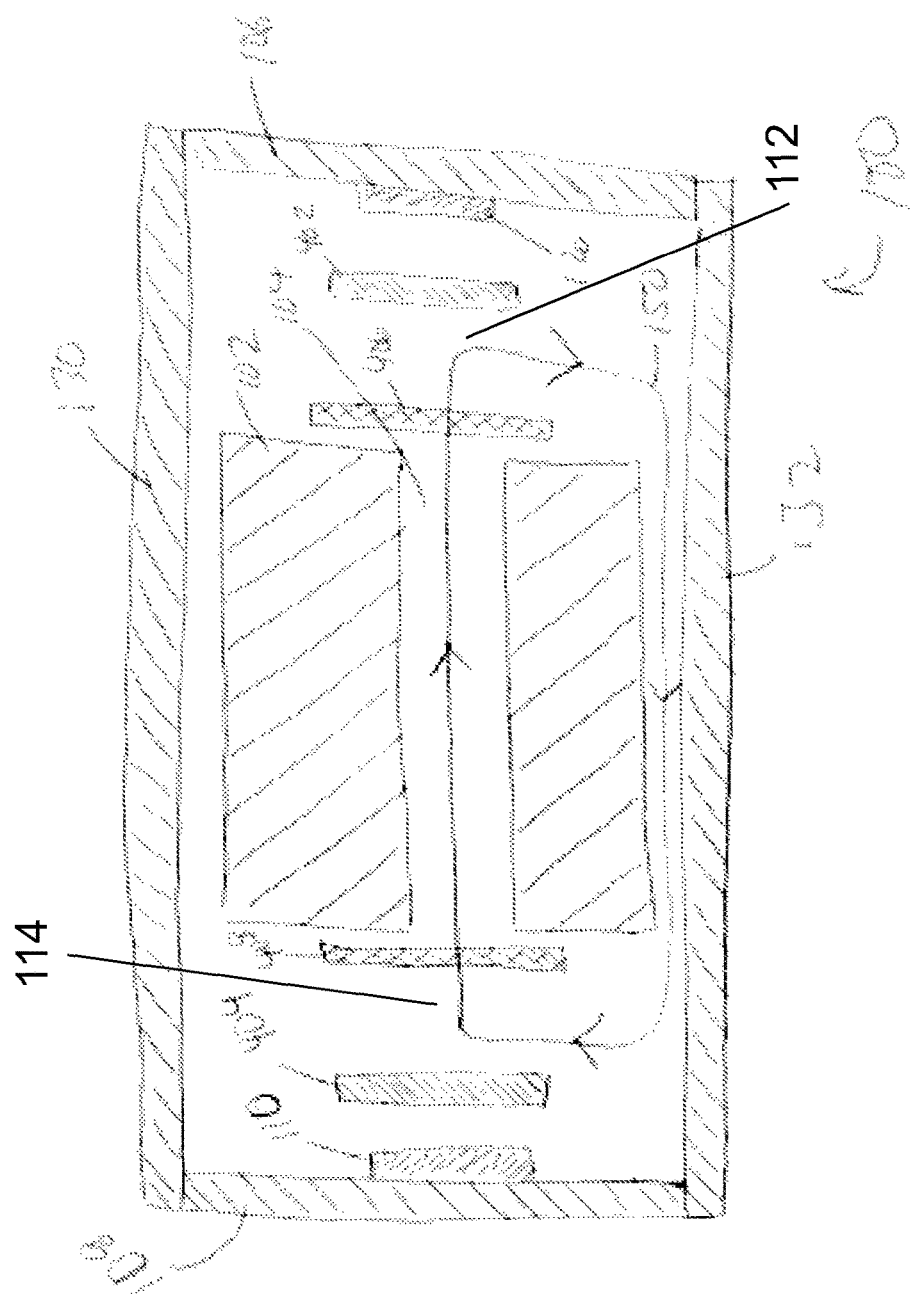
FIG. 4 is a cross-sectional view of the magnetic resonance imaging apparatus of FIG. 1, further illustrating gradient coils according to aspects of the present disclosure.

FIG. 4 shows an embodiment of the MRI scanner 100, further illustrating gradient coils positioned outside the bore 104 for patient imaging. A first gradient coil 402 and a second gradient coil 406 are positioned between a first opening of the bore 104 and the first shim 106. The first gradient coil 402 is positioned proximate the first shim 106. The second gradient coil 406 is positioned proximate the first opening of the bore 104. The first patient imaging area 112 is thus formed between the first gradient coil 402 and the second gradient coil 406. The first and second gradient coils 402 and 406 are configured to generate a gradient magnetic field within the first patient imaging area 112.

A third gradient coil 404 and a fourth gradient coil 408 are positioned between a second opening of the bore 104 and the second shim 108. The third gradient coil 404 is positioned proximate the second shim 108. The fourth gradient coil 408 is positioned proximate the second opening of the bore 104. The second patient imaging area 114 is thus formed between the third gradient coil 404 and the fourth gradient coil 408. The third and fourth gradient coils 404 and 408 are configured to generate a gradient magnetic field within the second patient imaging area 114.

During operation of the MRI scanner 100, the shim 106, having secondary shim 120 (and connected to the shim 108 by ferric connectors 130 and 132), draws the $B_0$ magnetic field of the magnet 102 out of the bore 104 into the first patient imaging area 112 and helps produce a substantially homogeneous first magnetic field in the first patient imaging area 112. Shims 106 and 108, having secondary shims 120 and 110, respectively, complete a magnetic circuit which generates a substantially homogeneous second magnetic field in the second patient imaging area 114.

Gradient coils 406 and 402 in the first patient imaging area 112 and gradient coils 408 and 404 in the second patient imaging area 114 can generate gradient magnetic fields in the patient imaging areas 112 and 114, respectively. In various embodiments, the gradient coils may be connected to a processor (not shown) of the MRI system. The processor may include hardware and software and may record data generated by RF coils for detecting magnetic field fluxes orthogonal to the $B_0$ magnetic field. In various embodiments disclosed herein, RF coils may be positioned proximate to the tissue of the patient being imaged and may be configured to at least one of transmit and receive a magnetic resonance imaging signal.

In operation, a patient is positioned in either patient imaging area 112 or 114, and in some embodiments a second patient is positioned in the other patient imaging area 112 or 114. The patient may be in a standing or seated position. The tissue of the patient that is being imaged, such as the patient's breasts, is positioned within the patient imaging area 112 or 114 such that when the MRI scanner 100 is in operation, the tissue will be within the magnetic field of the patient imaging area that is substantially homogeneous. It is to be appreciated that in some embodiments, the tissue being imaged may be substantially immobilized within an immobilization structure, such as fenestrated plates or compression plates (not shown).

Figure 5:
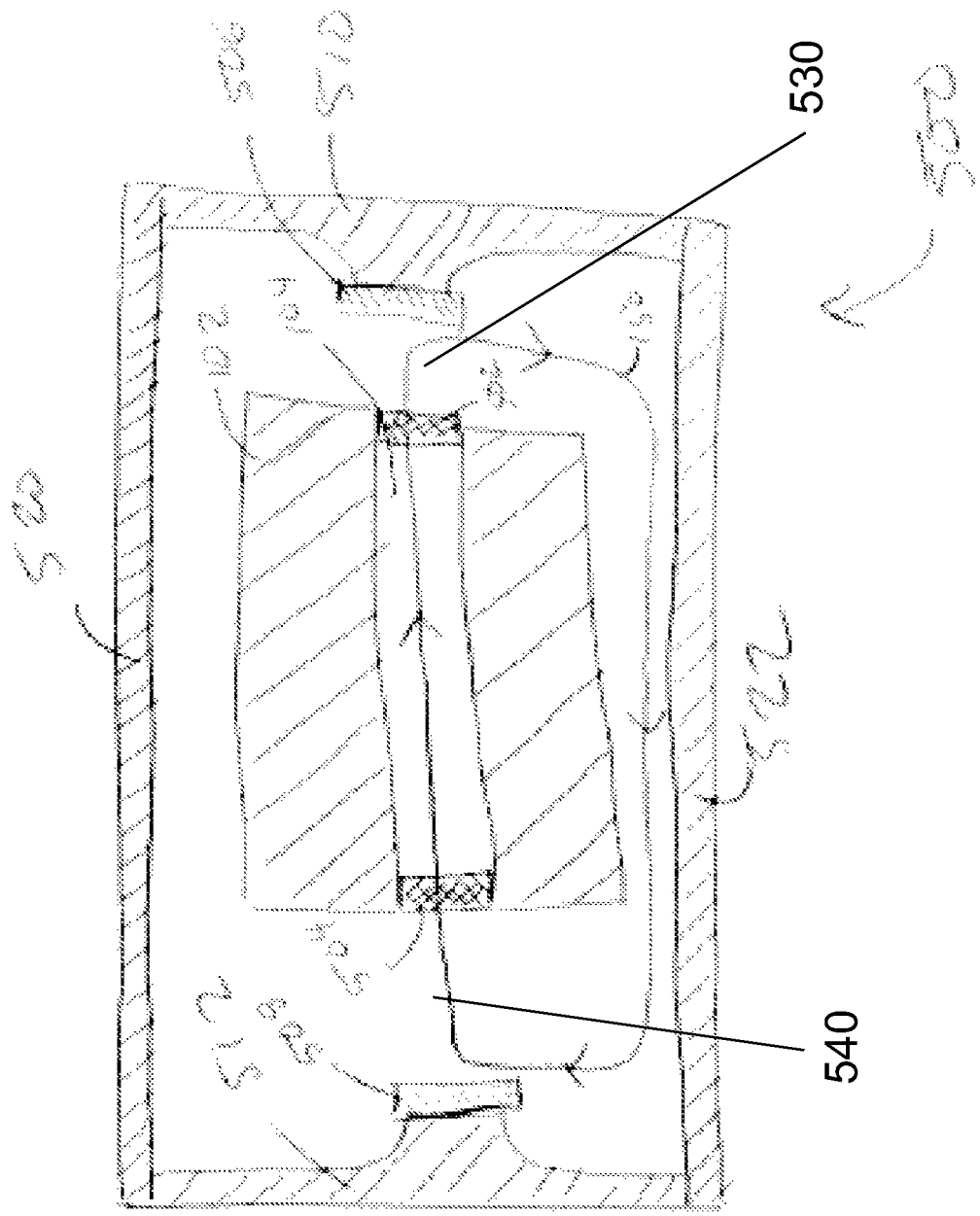
FIG. 5 is a cross-sectional view of another embodiment of a magnetic resonance imaging apparatus according to aspects of the present disclosure.

FIG. 5 shows another embodiment of an MRI scanner 500 which operates in a substantially similar manner to the MRI scanner 100 shown in FIGS. 1 to 4. The MRI scanner 500 has an MRI magnet 102 having a bore 104 and additionally has ferric elements 510 and 512, which perform a similar function to the shims 106 and 108 having secondary shims 120 and 110. Each of the first ferric element 510 and the second ferric element 512 has a respective extended portion positioned such that it is directed towards the bore 104 of the magnet 102, the extended portion being integral to the respective ferric elements 510 and 512. The ferric elements 510 and 512 may be shims and may comprise iron or, additionally or alternatively, another suitable ferric material. The ferric elements 510 and 512 are connected by ferric connectors 520 and 522, which may, in some embodiments, comprise the same ferric material as the ferric elements 510 and 512.

The MRI scanner 500 further includes a first gradient coil 502 coupled to a first end of the bore 104 and a second gradient coil 506 coupled to the first ferric element 510, and more specifically to the extended portion of the first ferric element. A first patient imaging area 530 is formed between the first and second gradient coils 502 and 506. The gradient coils 502 and 506 are configured to generate a gradient magnetic field within the first imaging area 530.

The MRI scanner 500 further includes a third gradient coil 504 coupled to a second end of the bore 104 and a fourth gradient coil 508 coupled to the second ferric element 512, and more specifically to the extended portion of the second ferric element. A second patient imaging area 540 is formed between the third and fourth gradient coils 504 and 508. The gradient coils 504 and 508 are configured to generate a gradient magnetic field within the second imaging area 540.

The first ferric element 510 is positioned such that, when the MRI scanner 500 is operated, the $B_0$ magnetic field of the magnet 102 is drawn out of the bore 104 into the first patient imaging area 530, wherein the drawn out $B_0$ magnetic field is substantially homogeneous in the first patient imaging area and substantially parallel to the $B_0$ magnetic field within the bore. The second ferric element 512 is positioned such that the returned field of the magnetic circuit 150 is substantially homogeneous in the second patient imaging area 540 and substantially parallel to the $B_0$ within the bore 104.

As described above, the gradient coils 502 and 506 in the first patient imaging area 530 and gradient coils 504 and 508 in the second patient imaging area 540 may be configured to generate gradient magnetic fields in the patient imaging areas 530 and 540, respectively. In various embodiments, the gradient coils may be connected to a processor of the MRI system. The processor may record data generated by RF coils for detecting magnetic field fluxes orthogonal to the $B_0$ magnetic field.

The embodiments illustrated in FIGS. 1 to 5 are configured to provide two patient imaging areas, each positioned at one end of the magnet bore of an MRI device. It is to be appreciated that another embodiment may provide a different number of patient imaging areas. For example, in other embodiments, the MRI scanners 100 and 500 of FIGS. 1 to 5 may only provide a single imaging area outside the bore. In other embodiments, an apparatus may be configured to provide one imaging area outside the magnet bore, as described below with reference to FIGS. 6 and 7.

Figure 6:
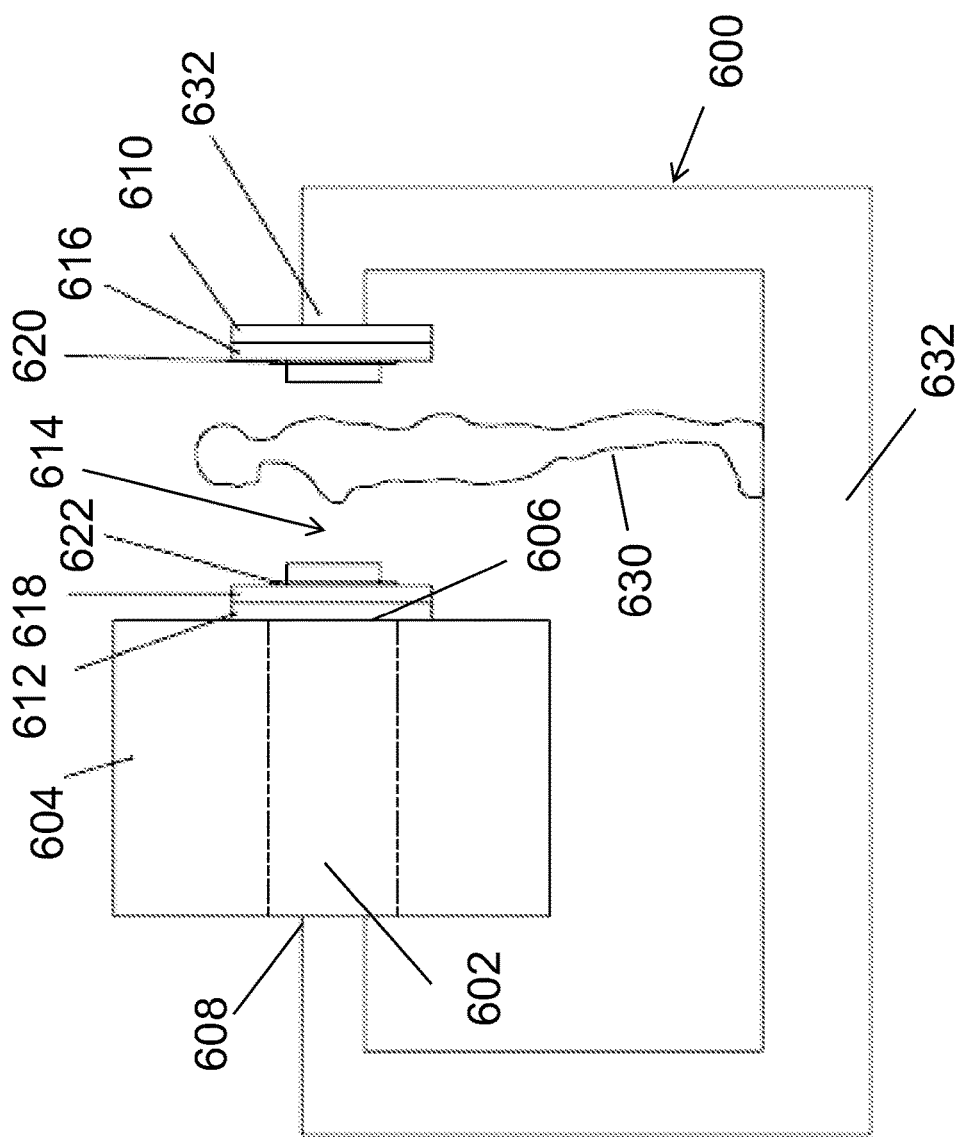
FIG. 6 is a side view of another embodiment of a magnetic resonance imaging apparatus providing a patient imaging area outside the bore and further illustrating imaging of a patient within the patient imaging area outside the bore according to aspects of the present disclosure.
Figure 7:
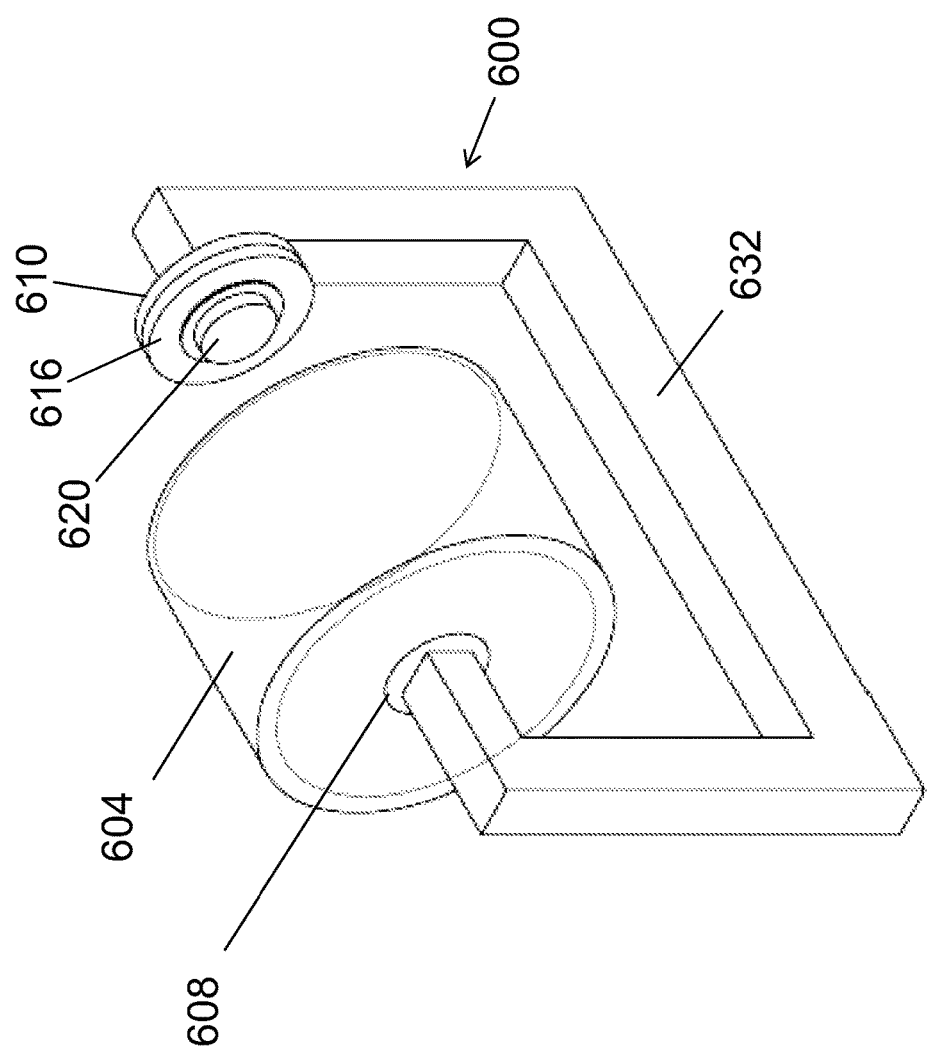
FIG. 7 is a perspective view of the apparatus of FIG. 6.

FIGS. 6 and 7 illustrate side and perspective views of another embodiment of an apparatus 600 for providing an imaging area outside the bore 602 of a magnet 604 of an MRI device. The bore 602 has a first end 606 and a second end 608. The apparatus 600 includes a first shim 610 and a second shim 612 positioned external to the first end 606 of the bore 602. The second shim 612 is shown to be coupled to the first end 606 of the bore 602. In other embodiments, the second shim 612 need not be coupled to the bore and may be positioned at a distance from the first end 606. The first shim 610 is positioned outside and spaced apart from the first end 606 of the bore 602, to form a patient imaging area 614 between the first shim 610 and the second shim 612. In other embodiments, the apparatus 600 may only include a single shim and the patient imaging area may be formed between that shim and the first end or opening of the bore.

The first and second shims 610 and 612 are configured to direct the magnetic field of the magnet 604 from within the bore 602 to the patient imaging area 614 to provide a magnetic field within the patient imaging area. The shims 610 and 612 may further be configured to affect the magnetic field such that the magnetic field within the patient imaging area 614 is substantially homogeneous and, optionally, substantially parallel to the magnetic field within the bore 602.

The apparatus 600 optionally further includes a first gradient coil 616 and a second gradient coil 618 positioned between the first shim 610 and the second shim 612. As shown in FIG. 6, the first gradient coil 616 may be positioned proximate to the first shim 610 and the second gradient coil 618 may be positioned proximate to the second shim 612. The gradient coils are configured to generate a gradient magnetic field within the patient imaging area 614 to allow magnetic resonance imaging. The patient imaging area 614 is thus formed between the first and second gradient coils 616 and 618. The apparatus 600 further includes RF coils 620 and 622.

The apparatus 600 further includes a ferric connector 632 coupled to the first shim 610 and to the second end 608 of the bore 602. The ferric connector 632 is configured to direct the magnetic field external to the magnet 602 or external to the MRI device including the magnet and further along a direction substantially parallel to the bore 602. The ferric connector 632 is also configured to return the magnetic field at the second end 608 of the bore. In other embodiments, the apparatus 600 may include a plurality of ferric connectors.

As shown in FIG. 6, a patient 630 is positioned in the patient imaging area 614 between the gradient coils 620 and 622. The patient 630 is shown in a standing position; however, in other embodiments, the apparatus 600 may be configured to accommodate a patient in a seated position. In some embodiments, an immobilization structure may be provided to substantially immobilize a tissue of the patient 630 for imaging. During operation, the magnet 604 generates a magnetic field which is substantially uniform or homogeneous within the bore 602. The apparatus 600 allows the magnetic field to be drawn from the bore 602 to the patient imaging area 614. The magnetic field within the patient imaging area 614 may be substantially uniform or homogeneous to allow for magnetic resonance imaging. The gradient coils 616 and 618 provide a gradient magnetic field and the RF coils 620 and 622 transmit and receive magnetic resonance imaging signals for imaging the patient 630.

In various embodiments, MRI throughput is improved by reducing patient setup time due to imaging the patient outside the bore relative to a conventional MRI device which requires the patient to be positioned within the bore. In some embodiments, the apparatus 600 may further be configured to provide a second patient imaging area proximate to the second end 608 of the bore 602, as shown for example in FIG. 4. At the second end 608, the apparatus may be configured similarly to the configuration at the first end 606 as described above and illustrated in FIG. 6.

In various embodiments, the apparatus 600 may further be configured to include one or more additional features disclosed herein. For example, the apparatus 600 may further include one or more gradient amplifiers configured to amplify the gradient field generated by the gradient coils 616 and 618. The apparatus 600 may be configured to provide an enclosure sized to include the magnet 604 or the MRI device including the magnet. The enclosure may have a plurality of surfaces. In one example, the plurality of surfaces may include at least one of the first shim 610 and the ferric connector 632. In some embodiments, the enclosure may be sound proofed.

In some embodiments, a shim, such as shim 610, may include an integral portion extended towards the bore 602. In other embodiments, the apparatus 600 may include one or more secondary shims positioned to affect the magnetic field within the patient imaging area 614, for example to provide a substantially homogeneous magnetic field within the patient imaging area.

In FIGS. 6 and 7, the apparatus 600 is described above as being separate from the MRI device that includes the magnet 604 having the bore 602, wherein the apparatus is configured to couple to the MRI device. The MRI device may be a conventional MRI system and the apparatus 600 may be configured to retrofit the conventional MRI system. However, in various embodiments, the apparatus 600 may further include the MRI device having the magnet 604 and the bore 602, thereby providing a complete system for magnetic resonance imaging outside the bore.

Furthermore, referring again to FIGS. 1 to 5, the MRI scanners 100 and 500 were described above as being MRI systems that include a central magnet having a bore and further including one or more elements configured to provide patient imaging areas outside the bore. However, in various embodiments, the magnet having the bore and other conventional MRI elements may not be included in the MRI scanners 100 and 500, and the MRI scanners 100 and 500 may only include one or more elements configured to retrofit a conventional MRI device to provide one or more patient imaging areas outside the bore of the MRI device.

Figure 8:
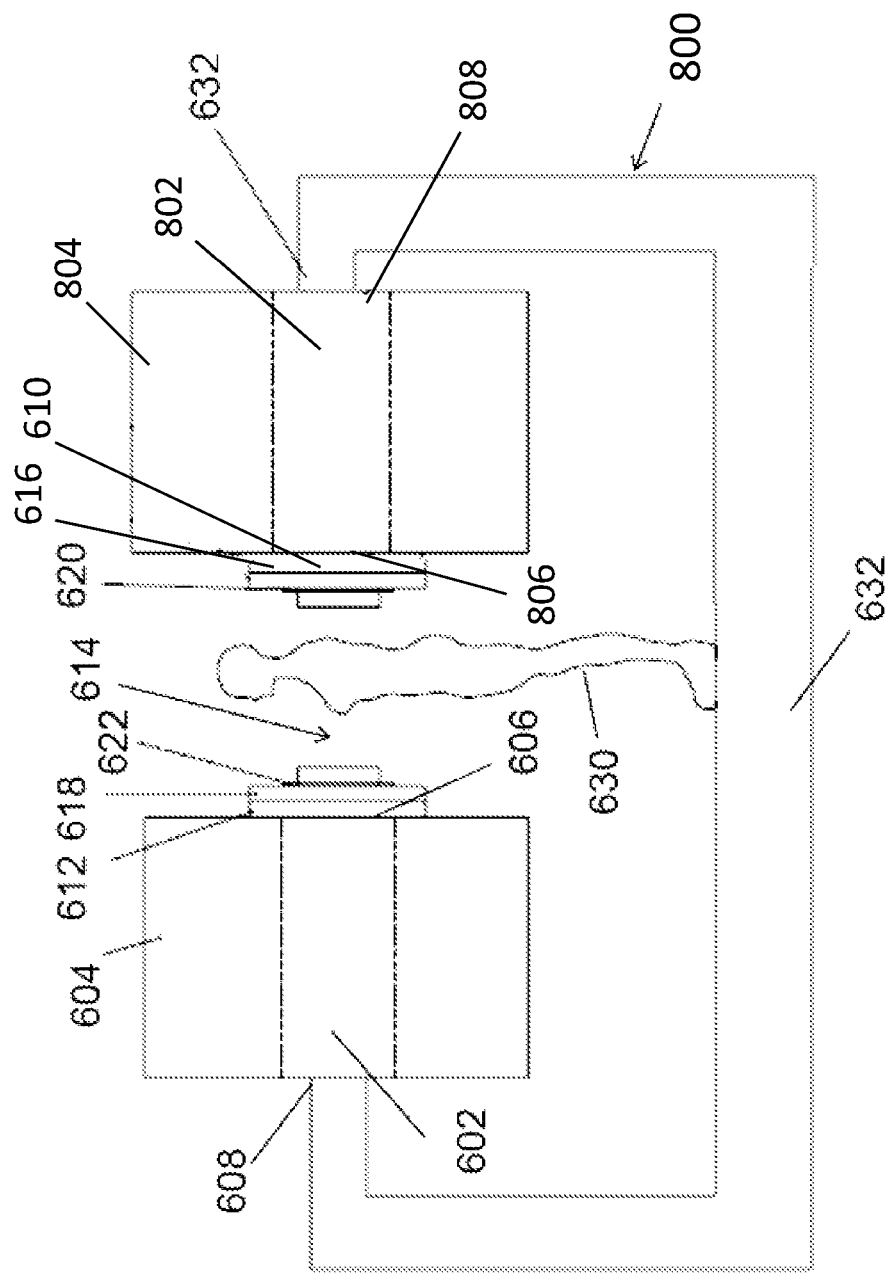
FIG. 8 is a side view of another embodiment of a magnetic resonance imaging apparatus providing a patient imaging area between two magnets according to aspects of the present disclosure.

FIG. 8 is a side view of another embodiment of a magnetic resonance imaging apparatus 800 including various elements of the apparatus 600 of FIG. 6. The apparatus 800 is configured to couple to the magnet 604 and a second magnet 804 having a bore 802, such that the patient imaging area 614 is formed between the two magnets. In particular, the ferric connector 632 has respective ends coupled to the respective magnets 604 and 804 and configured to draw the magnetic field external to both magnets. The ferric connector 632 is coupled to the second end 608 of the bore 602 and a second end 808 of the bore 802 of the second magnet 604. The first shim 610 is coupled to a first end 806 of the bore 802 of the second magnet 804, wherein the first end of the bore is proximate to the patient imaging area 614. The second magnet 804 may generate a magnetic field that has the same direction as the magnetic field of the magnet 604. In other embodiments, any number of magnets may be configured to create a magnetic field outside the magnets for patient imaging.

According to other aspects, methods of providing one or more patient imaging areas outside a bore of an MRI device and methods of imaging outside the bore are disclosed. Examples are provided and described next with reference to FIGS. 8 and 9.

Figure 9:
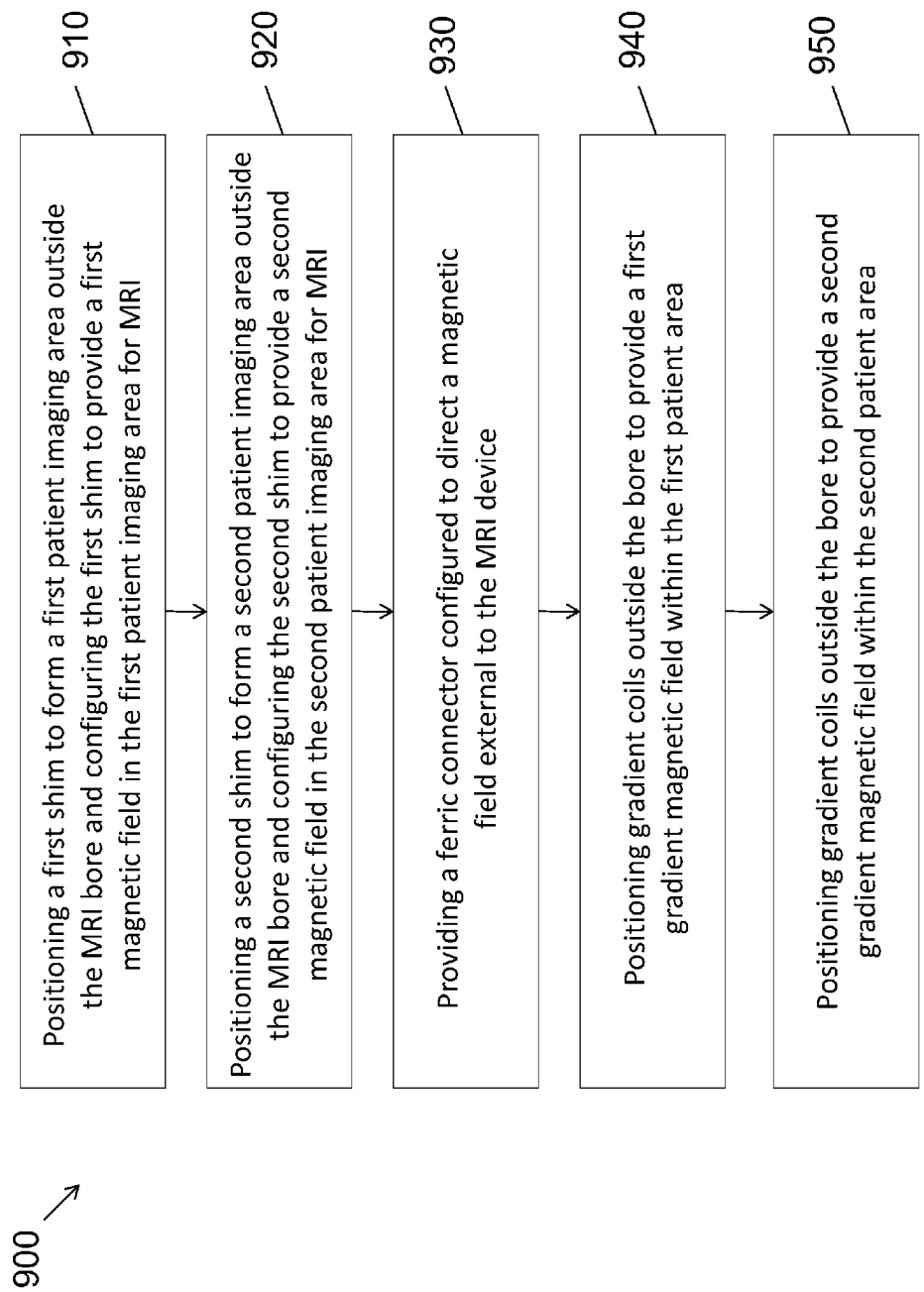
FIG. 9 is a block diagram of one example of a method of providing at least one patient imaging area outside a bore of a magnetic resonance imaging device according to aspects of the present disclosure.

FIG. 9 shows a block diagram of one example of a method 900 of providing at least one patient imaging area outside a bore of an MRI device. The MRI device may be a conventional MRI device or an MRI device having a horizontally oriented bore and the method 900 may be applied to retrofit the MRI device for improved patient comfort and throughput.

The method 900 includes an act 910 of positioning a first shim to form a first patient imaging area outside the MRI bore, and configuring the first shim to provide a first magnetic field in the first patient area for magnetic resonance imaging, as shown for example in FIG. 4. The first magnetic field may be substantially homogeneous. The first magnetic field may also be substantially parallel to the bore. The first magnetic field may be provided with the combination of the bore and the first shim. In various embodiments, positioning the first shim and configuring the first shim may be performed as separate acts or may be performed as a single act. The method 900 further includes an act 920 of positioning a second shim to form a second patient imaging area outside the MRI bore, and configuring the second shim to provide a second magnetic field in the second patient area for magnetic resonance imaging, as shown for example in FIG. 4. The second magnetic field may be substantially homogeneous. The second magnetic field may also be substantially parallel to the bore. The second magnetic field may be provided with the combination of the bore and the second shim. In various embodiments, positioning the second shim and configuring the second shim may be performed as separate acts or may be performed as a single act.

The method 900 further includes an act 930 of providing a ferric connector. The ferric connector may be coupled to at least one of the first and second shims configured in acts 910 and 920. The ferric connector may be configured to direct the magnetic field of the MRI device externally to the MRI device, as shown for example in FIGS. 1 to 8. Act 930 of providing the ferric connector may include configuring the ferric connector to direct the magnetic field from the first patient imaging area formed in act 910 to the second patient imaging area formed in act 920 and may further include directing the magnetic field along a direction substantially parallel to the bore.

The method 900 further includes an act 940 of positioning gradient coils outside the bore, for example outside a first end of the bore, and configuring the gradient coils to provide a first gradient magnetic field within the first patient area formed in act 910. Positioning gradient coils to provide a first gradient magnetic field within the first patient imaging area may include positioning a first gradient coil and a second gradient coil between the first shim and a first end of the bore as shown for example in FIG. 4, or between two shims positioned outside a first end of the bore, such that the first patient imaging area is formed between the first gradient coil and the second gradient coil, as shown for example in FIG. 6.

The method 900 further includes an act 950 of positioning additional gradient coils outside the bore and configuring the additional gradient coils to provide a second gradient magnetic field within the second patient area formed in act 920. Positioning gradient coils to provide a gradient magnetic field within the second patient imaging area may include positioning a third gradient coil and a fourth gradient coil between the second shim and a second end of the bore, as shown for example in FIG. 4, or between two shims positioned outside the second end of the bore, such that the second patient imaging area is formed between the third gradient coil and the fourth gradient coil.

In some embodiments, the method 900 may further include additional acts such as providing additional shims at one or both ends of the bore to affect the magnetic field for imaging outside the bore. Additional acts may include providing at least one secondary shim, for example to form a substantially homogeneous first magnetic field in the first patient imaging area. In some embodiments, the method 900 may include an act of enclosing the MRI device using one or more of the shims and ferric connectors.

In some embodiments, the method 900 may further include an act of positioning at least one gradient amplifier external to the MRI device and external to a patient imaging area and configuring the gradient amplifiers to amplify a gradient magnetic field within a patient imaging area. The method 900 may further include an act of providing at least one RF coil within a patient imaging area outside the bore, wherein the RF coil is configured to transmit or receive MRI signals. In some embodiments, the method 900 may further include providing an immobilization structure in a patient imaging area outside the bore, and configuring the immobilization structure to receive and immobilize a tissue to be imaged.

In various embodiments, the method 900 may comprise fewer acts than those shown in FIG. 9. For example, in one example, the method 900 may exclude acts 920 and 950, thus providing only a single patient imaging area outside the bore as shown for example in FIGS. 6 and 7. In this example, the method 900 may include providing one or more shims positioned at one end of the bore to form a patient imaging area at that end of the bore. Providing the ferric connector may further include coupling the ferric connector to one end of the bore and to a shim positioned at the other end of the bore as shown for example in FIGS. 6 and 7.

It is to be appreciated that one or more acts of the method 900 may overlap, may be performed substantially in parallel, or may be performed in another order.

Figure 10:
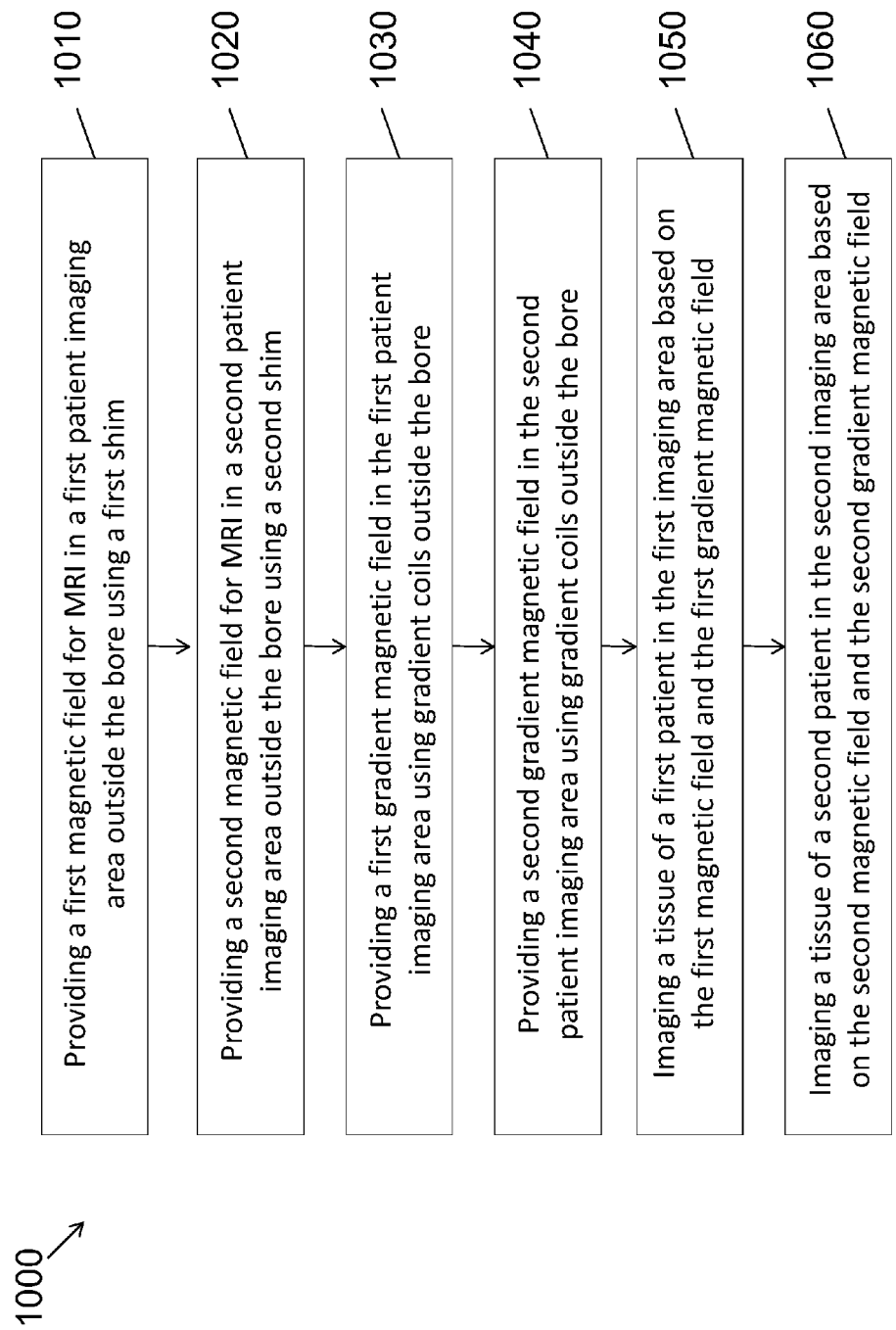
FIG. 10 is a block diagram of one example of a method of magnetic resonance imaging according to aspects of the present disclosure.

FIG. 10 is a block diagram of one example of a method 1000 of magnetic resonance imaging according to aspects of the present disclosure. The method 1000 may be performed, for example, by using the apparatus shown in FIG. 4. The method 1000 includes an act 1010 of providing a first magnetic field for magnetic resonance imaging in a first patient imaging area outside the bore using a first shim. The first magnetic field may further be provided in combination with other elements, such as in combination with the magnet bore of the MRI device. The first magnetic field may be substantially homogeneous within the first patient imaging area and may further be substantially parallel to the magnetic field within the bore. The method 1000 further includes an act 1020 of providing a second magnetic field for magnetic resonance imaging in a second patient imaging area outside the bore using a second shim. The second magnetic field may further be provided in combination with other elements, such as in combination with the magnet bore of the MRI device. The second magnetic field may be substantially homogeneous within the second patient imaging area and may further be substantially parallel to the magnetic field within the bore.

The method 1000 further includes an act 1030 of providing a first gradient magnetic field in the first patient imaging area using gradient coils outside the bore, for example gradient coils positioned on one side of the bore, and an act 1040 of providing a second gradient magnetic field in the second patient imaging area using additional gradient coils outside the bore, for example using gradient coils positioned on the other side of the bore. Providing gradient coils may include providing one or more gradient coils within a patient imaging area, as shown and described above in relation to various embodiments.

The method 1000 further includes an act 1050 of imaging a tissue of a first patient in the first imaging area based on the first magnetic field provided in act 1010 and the first gradient magnetic field provided in act 1030. The method 1000 further includes an act 1060 of imaging a tissue of a second patient in the second imaging area based on the second magnetic field provided in act 1020 and the second gradient magnetic field provided in act 1040. The imaging acts 1050 and 1060 may further include, for example, transmitting or receiving RF signals for magnetic resonance imaging.

In various embodiments, the method 1000 may comprise additional acts not shown in FIG. 10. For example, in one example, the method 1000 may further include immobilizing a tissue of a patient to be imaged. In various embodiments, the method 1000 may also comprise fewer acts than those shown in FIG. 10. For example, in one example, the method 1000 may exclude acts 1020, 1040 and 1060, thereby imaging a patient in a single imaging area outside the bore as shown for example in FIGS. 6 and 7.

Furthermore, it is to be appreciated that one or more acts of the method 1000 may overlap, may be performed substantially in parallel, or may be performed in another order. For example, the acts 1050 and 1060 of imaging a first patient and a second patient may be performed substantially simultaneously. In other examples, the act 1050 of imaging a patient in the first imaging area may include, for example, acts 1010 and 1030 of providing a uniform magnetic field and a gradient magnetic field in the first patient imaging area, and the act 1060 of imaging a patient in the second imaging area may include, for example, acts 1020 and 1040 of providing a uniform magnetic field and a gradient magnetic field in the second patient imaging area.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. An apparatus for providing at least one patient imaging area outside a bore, the bore being within a magnet of a magnetic resonance imaging device, the apparatus comprising:
   a first shim disposed external to and spaced apart from a first opening of the bore;
   a second shim disposed between the first opening and the first shim;
   wherein the first shim is configured to direct a magnetic field of the magnet within the bore into a first patient imaging area between the first and second shims.

2. The apparatus of claim 1, wherein the magnetic field in the first imaging area is substantially homogeneous.

3. The apparatus of claim 1, wherein the magnetic field within the first patient imaging area is substantially parallel to the magnetic field within the bore.

4. The apparatus of claim 1, further comprising a ferric connector coupled to the first shim and a second opening of the bore and configured to direct the magnetic field externally of the magnetic resonance imaging device.

5. The apparatus of claim 4, further comprising an enclosure sized to enclose the magnetic resonance imaging device, the enclosure having a plurality of surfaces including at least one of the first shim and the ferric connector.

6. The apparatus of claim 1 further comprising at least one gradient amplifier disposed external to the magnetic resonance imaging device and external to the first patient imaging area, the at least one gradient amplifier being configured to amplify a gradient magnetic field within the first patient imaging area.

7. The apparatus of claim 1, wherein the secondary shim is configured to create a substantially homogeneous magnetic field in the first patient imaging area.

8. The apparatus of claim 1, wherein the first shim includes an integral portion configured to extend towards the first opening and a second portion that is disposed substantially perpendicular to the bore.

9. An apparatus for providing at least one patient imaging area outside a bore, the bore being within a magnet of a magnetic resonance imaging device, the apparatus comprising:
- a first shim disposed external to and spaced apart from a first opening of the bore to form a first patient imaging area between the first shim and the first opening, wherein the first shim is configured to direct a magnetic field of the magnet within the bore into the first patient imaging area to provide a first magnetic field in the first patient imaging area; and
- a first gradient coil and a second gradient coil disposed between the first shim and the first opening, the first patient imaging area being formed between the first gradient coil and the second gradient coil, the first gradient coil and the second gradient coil being configured to generate a gradient magnetic field within the first patient imaging area;
- a second shim disposed external to and spaced apart from a second opening of the bore;
- wherein the second shim is configured to direct a magnetic field into a second patient imaging area between the second shim and the second opening.

10. The apparatus of claim 9, further comprising at least one radio frequency coil disposed within the first patient imaging area and configured to at least one of transmit and receive a radio frequency signal for magnetic resonance imaging within the first patient imaging area.

11. The apparatus of claim 9, further including an immobilization structure in the first patient imaging area, the immobilization structure being configured to receive a tissue to be imaged and to immobilize the tissue for imaging.

12. The apparatus of claim 9, wherein the second magnetic field is substantially homogeneous.

13. The apparatus of claim 9, wherein the second shim and the bore provide the second magnetic field within the second patient imaging area, the second magnetic field being substantially parallel to the magnetic field within the bore.

14. The apparatus of claim 9, further comprising at least one ferric connector coupled to at least one of the first shim and the second shim.

15. The apparatus of claim 14, wherein the at least one ferric connector is configured to direct the magnetic field externally to the magnetic resonance imaging device and along a direction substantially parallel to the bore.

16. A magnetic resonance imaging apparatus comprising:
- a magnet having a bore and configured to generate a substantially homogeneous magnetic field within the bore;
- a first shim disposed external to a first opening of the bore to form a first external patient imaging area between the first shim and the first opening, the first shim being configured to extend the magnetic field within the bore into the first patient imaging area to provide a first magnetic field in the first patient imaging area; and
- a second shim disposed external to and spaced apart from a second opening of the bore to form a second patient imaging area between the second shim and the second opening;
- wherein the second shim is configured to direct the magnetic field of the magnet into the second external patient imaging area to provide a second magnetic field in the second patient imaging area.

17. The magnetic resonance imaging apparatus of claim 16, wherein the first magnetic field is substantially homogeneous.

18. The magnetic resonance imaging apparatus of claim 16, wherein the first magnetic field is substantially parallel to the magnetic field within the bore.

* * * * *